(12) United States Patent
Acharyya et al.

(10) Patent No.: US 7,550,987 B2
(45) Date of Patent: Jun. 23, 2009

(54) METHOD AND CIRCUIT FOR MEASURING OPERATING AND LEAKAGE CURRENT OF INDIVIDUAL BLOCKS WITHIN AN ARRAY OF TEST CIRCUIT BLOCKS

(75) Inventors: Dhruva J. Acharyya, Austin, TX (US); Sani R. Nassif, Austin, TX (US); Rahul M. Rao, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 303 days.

(21) Appl. No.: 11/679,346

(22) Filed: Feb. 27, 2007

(65) Prior Publication Data

US 2008/0209285 A1      Aug. 28, 2008

(51) Int. Cl.
*G01R 31/26* (2006.01)
(52) U.S. Cl. .......................... 324/763; 324/765
(58) Field of Classification Search ................ None
See application file for complete search history.

(56) References Cited

U.S. PATENT DOCUMENTS 6,838,869 B1 * 1/2005 Rogers et al. ............ 324/158.1
7,088,131 B1    8/2006 Stout et al.
7,423,446 B2 * 9/2008 Agarwal et al. ............ 324/769

OTHER PUBLICATIONS

U.S. Appl. No. 11/422,913, filed Jun. 8, 2006, Agarwal, et al.
U.S. Appl. No. 11/462,186, filed Aug. 3, 2006, Agarwal, et al.

* cited by examiner

*Primary Examiner*—Minh N Tang
(74) *Attorney, Agent, or Firm*—Mitch Harris, Atty at Law, LLC; Andrew M. Harris; Libby Z. Handelsman

(57) ABSTRACT

A method and circuits for measuring operating and leakage current of individual blocks within an array of test circuit blocks provides measurement free of error due to leakage currents through non-selected circuit blocks, without requiring an independent test facility for each circuit block. The circuit includes a pair of power supply grids and selection circuits at each test circuit block to select between a test power grid and a "rest" power grid used to supply current to the non-selected circuits. The leakage currents through the non-selected circuits are thus sourced from the rest grid and error that would otherwise be introduced in the test grid current measurement is avoided. The test circuit blocks may be ring oscillators, and the measured current may be the operating and/or leakage current of the ring oscillator. The circuit blocks may also include individual devices for IV (current-voltage) characterization using an additional gate input grid.

20 Claims, 4 Drawing Sheets

METHOD AND CIRCUIT FOR MEASURING OPERATING AND LEAKAGE CURRENT OF INDIVIDUAL BLOCKS WITHIN AN ARRAY OF TEST CIRCUIT BLOCKS

BACKGROUND OF THE INVENTION

1. Field of the Invention

The present invention is related to integrated circuit characterization methods and circuits, and more particularly to a circuit and method for measuring current in individual circuits and devices in a test integrated circuit.

2. Description of Related Art

Characterization integrated circuits are in common use to evaluate designs on processes and have become increasingly necessary as processes have shrunk. Ring oscillator circuits are frequently used in such designs to study device characteristic variations that lead to variations in circuit parameters such as delay. Performance screen ring oscillators (PSROs) are implemented along with functional circuits in a production integrated circuit to assist in production screening and as a design/process improvement tool. Since it is relatively easy to accurately measure the output frequency of a ring oscillator, and the output frequency is typically directly related to propagation delay, frequency measurements provide a effective means for studying process and design effects on circuit propagation delay.

A large number of ring oscillators may be implemented on a characterization die and individually enabled to provide local measurements of process characteristics. Further, multiple ring oscillators may also be used to study different designs and devices, such as transistors with varying channel width and the effect of such width variation on a circuit incorporating the transistor.

It is generally also desirable to know the current consumed by a particular circuit design/device and/or the variations of such currents across a die and across wafers, in particular since device strength variations are directly revealed. Measuring the operating current of a single ring oscillator that shares a power connection with other ring oscillators typically requires disabling all of the ring oscillators except for the ring oscillator under measurement. However, in such a scheme, the leakage current through all of the inactive oscillators can be significant and degrade the resolution of the current measurement. Further, the leakage current of a single ring oscillator cannot be measured, as the leakage due to a single inactive ring oscillator cannot be isolated in such a scheme. Alternative solutions using a separate power supply for each ring oscillator require an excess of pads and tester facility to perform multiple simultaneous ring oscillator frequency measurements and current measurements.

Similarly, it is desirable to characterize individual devices within a characterization integrated circuit. Existing characterization arrays typically use an array arrangement with rows and columns used to direct the current through an individual device, permitting voltage/current (IV) characterization. However, such circuits and test methodologies are not adequate for testing high speed circuits such as ring oscillators. The power delivery system of the above-described array circuits are not robust enough for proper operation, as high speed circuits typically require a power and ground distribution grid having a much lower impedance than the above-described array circuits. Therefore such array test circuits are typically only used for DC characterization. Further, such designs are not easily scalable, as the matrix must typically be increased by rows and columns, the drivers and sense circuits must be scaled to the new size, and the physical location of the row and column circuits must be adjusted as the matrix is expanded or contracted.

Therefore, it would be desirable to provide a method and circuit for accurately measuring ring oscillator operating and leakage current without requiring a separate power supply for each ring oscillator, and while providing for proper high speed operation of the ring oscillator circuit. It would further be desirable to provide a scalable method and circuit in which AC characteristics may be accurately measured by ring oscillator frequency and current measurement, and DC characteristics such as current-voltage curves of individual devices and AC characteristics of the device can be accurately measured. It would further be desirable to provide a method and circuit through which DC characteristics of individual devices can be correlated to AC operation of circuits such as ring oscillators.

SUMMARY OF THE INVENTION

The above objectives of measuring operating and leakage current of individual ring oscillators and individual devices without requiring separate power supplies, providing a scalable characterization test circuit for AC and DC device characterization, and providing for correlation of DC device characteristics to AC operation of circuits such as ring oscillators is accomplished in a method and circuit. The method and circuit can be used to study process variation, extract device characteristics and perform other useful design and production measurements. The method may be partially embodied in a computer system executing program instructions for carrying out the steps of the method and may further be partially embodied in a computer program product containing program instructions in computer-readable form for carrying out the steps of the method.

The circuit includes multiple test circuit blocks that receive an input power supply voltage from a selectable power supply grid. The circuit under test is provided with power supply voltage through a "test" power grid and the remainder of the circuit blocks are supplied from a "rest" power grid. Which power supply power grid is applied at each circuit block is made by local selection at each block. The result is that leakage currents through the circuit blocks not under test are provided through the rest grid rather than the test grid. A sense grid is also uniquely enabled to the point of application of the test grid voltage to the circuit block under test, so that the applied power supply voltage can be accurately sensed.

The circuit blocks may be ring oscillators, other circuit blocks for which accurate current measurements are needed, and/or devices to be characterized with respect to an applied control voltage, such as a transistor gate voltage. A second sense grid is provided and selectively coupled to the control input of the circuit block under test, so that the applied control voltage can be accurately sensed. The current provided to the test grid is measured and allows for accurate measurement of ring oscillator current consumption in both oscillating and non-oscillating conditions, as well as device current vs. applied control voltage under both AC and DC test conditions.

The foregoing and other objectives, features, and advantages of the invention will be apparent from the following, more particular, description of the preferred embodiment of the invention, as illustrated in the accompanying drawings.

DETAILED DESCRIPTION OF PREFERRED EMBODIMENT

The present invention relates to a characterization circuit and method. The method may be a computer-performed method embodied in a computer program having program instructions for carrying out the method. The characterization circuit is used in the method and may be controlled by a computer or dedicated tester to provide a measure of operating and leakage current for each circuit block in the array. Leakage current and/or operating currents of other blocks are prevented from affecting the measurement by directing the power supply to the circuit block under test through a different power grid than the power supply provided to the rest of the circuits.

Figure 1:
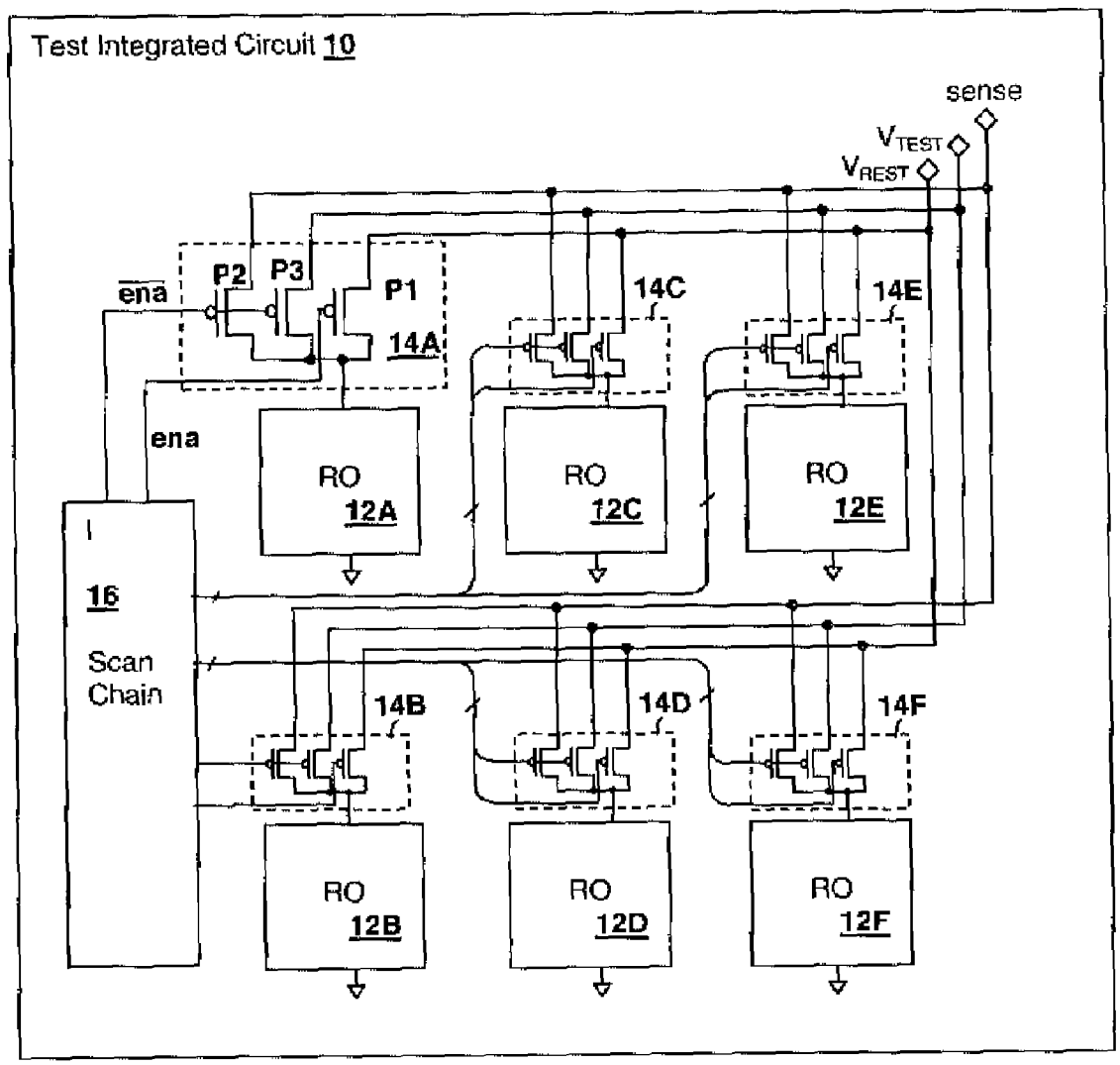
FIG. 1 is a schematic diagram depicting a test integrated circuit according to an embodiment of the present invention.

Referring now to FIG. 1, a test integrated circuit 10 is illustrated in accordance with an embodiment of the present invention. Multiple test circuit blocks, exemplified by ring oscillators 12A-12F are provided within test integrated circuit 10 and are supplied with current through corresponding selection circuits 14A-14F. Selection circuits receive unique enable signals such as signal ena (and inverted enable signal /ena) from scan chain 16 which is manipulated by a test system to select the individual ring oscillators 12A-12F for operating and leakage current measurements. The circuits for enabling and disabling oscillation of ring oscillators 12A-12F are not shown, but such operation can be accomplished by breaking the rings in response to another bit provided by scan chain 16 that is applied to an input of a logical AND gate within ring oscillators 12A-12F, as is well-known in the art. Each selection circuit 14A-14F is constructed as illustrated in selection circuit 14A. A transistor P1 is active when the ena signal is in a logical "0" state, so that when ring oscillator 12A is not selected for current measurement, current is supplied to ring oscillator 12A from a power grid $V_{REST}$ and any leakage or operating current drawn by ring oscillator 12A will be drawn from power grid $V_{REST}$. When the ena signal is in the logical "1" state, transistor P1 is deactivated and transistors P2-P3 are turned on, selecting the power supply rail input of ring oscillator 12A onto a power grid $V_{TEST}$ and also coupling a sense grid sense for measuring the voltage applied from power grid $V_{TEST}$ at ring oscillator 12A.

Operating and leakage current measurements are made by measuring the current drawn from a power supply connected to power grid $V_{TEST}$. Sense grid sense is used to sense the voltage applied to the power supply rail of ring oscillator 12A and generally the power supply connected to power grid $V_{TEST}$ will be raised or lowered for each circuit block under test (ring oscillator 12A-12F) either via programmatic control in response to measurement of sense grid sense, or a direct feedback connection to the external tester power supply, so that the current consumed and/or leaked by each ring oscillator 12A-12F is measured with respect to an identical power supply voltage. The tester sets scan chain 16 with binary values to sequentially enable selection circuit 14A-14F to supply current from power grid $V_{TEST}$ to each of ring oscillators 12A-12F, while supplying current from power grid $V_{REST}$ to the remaining ring oscillators. The current supplied to power grid $V_{TEST}$ and the voltage at sense grid sense is optionally measured for each selected ring oscillator, with the ring oscillator enabled (operating current) and disabled (leakage current), along with the standard ring oscillator frequency measurements.

Figure 2:
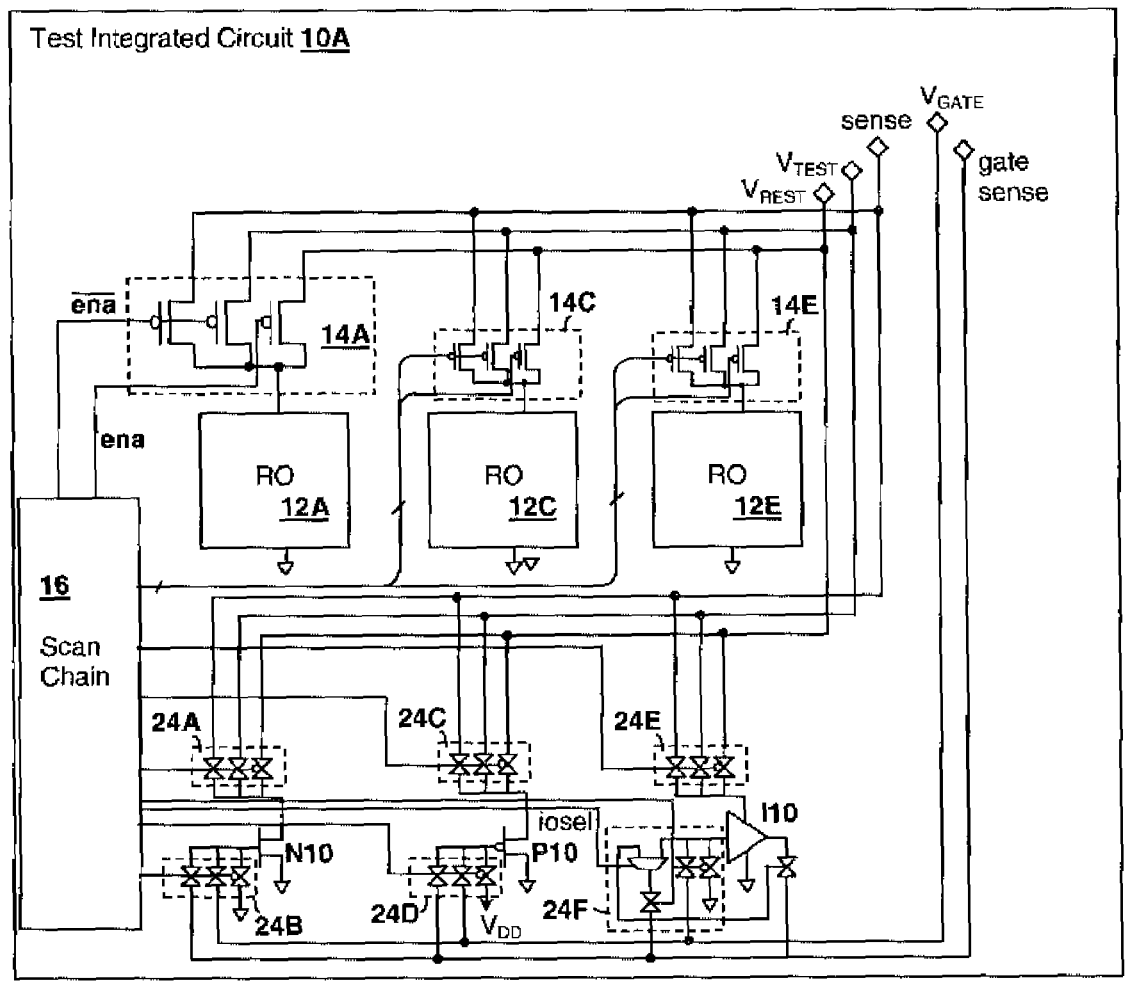
FIG. 2 is a schematic diagram depicting a test integrated circuit according to another embodiment of the present invention.

Referring now to FIG. 2, a test integrated circuit 10A is illustrated in accordance with another embodiment of the present invention. The circuit of FIG. 2 is similar to that of FIG. 1, and therefore only differences between them will be described in further detail below. Test integrated circuit 10A includes device characterization circuits in addition to ring oscillators 12A-12C, as exemplified by a N-channel transistor N10, a P-channel transistor P10 and an inverter I10. Selection circuits 14A-C are identical to those shown in FIG. 1, but additional selection circuits 24A-24F are provided to direct input voltage signals for characterization of transistors N10, P10 and inverter I10, so that static IV curves can be obtained. Further, AC tests can be performed (up to bandwidth limitations generally imposed by the grids) by applying a test waveform and measuring the amplitude and/or phase of the current supplied to power grid $V_{TEST}$ and the sense grid voltage. Selection circuits 24A-24E are similar or identical in structure and include transmission gates, rather than PFETs as in selection circuits 14A-14C, so that power supply and input voltages can be swept. Selection circuits 24A, 24C and 24E are used as described as for ring oscillator selection circuits 14A-14C, to selectively apply power grid $V_{TEST}$ and sense grid sense to the channel of one of transistors N10 or P10, or to the power supply rail of inverter I10. The remaining devices from among transistors N10, P10 and inverter I10 are selectively coupled to power grid $V_{REST}$. Selection circuits 24B and 24D select the gate terminal of N10 and P10, respectively, to two additional distribution grids: $V_{GATE}$ which provides an AC or DC signal to vary the voltage of the gate of a device under test and a gate sense grid that is used to either measure the gate voltage as applied, or in a feedback arrangement as described above with respect to the sense and $V_{TEST}$ grids, to control the voltage applied to grid $V_{GATE}$ so that the same gate voltage is applied to all devices under test. An additional transmission gate is included within selection circuits 24B and 24D, so that the gate of N10 is clamped to ground and the gate of P10 is clamped to $V_{DD}$ when the corresponding device is not selected for test. Clamping of the gates of devices not under test forces the devices to the 'off' state to ensure minimal current draw from the inactive devices.

Selection circuit 24F, associated with inverter I10, is similar to selection circuits 24A-24E, but includes a further selector for selecting between the output and input (gate terminals) of inverter I10, so that the transfer IV curve can be measured via grid gate sense once the proper gate voltage has been established. The iosel signal is provided from scan chain 16 for selection between the output and input of inverter I10 in application to grid gate sense. For measurements of the input characteristics of inverter I10, such as input capacitance, the iosel signal is maintained to select the input terminal onto grid gate sense.

Figure 3:
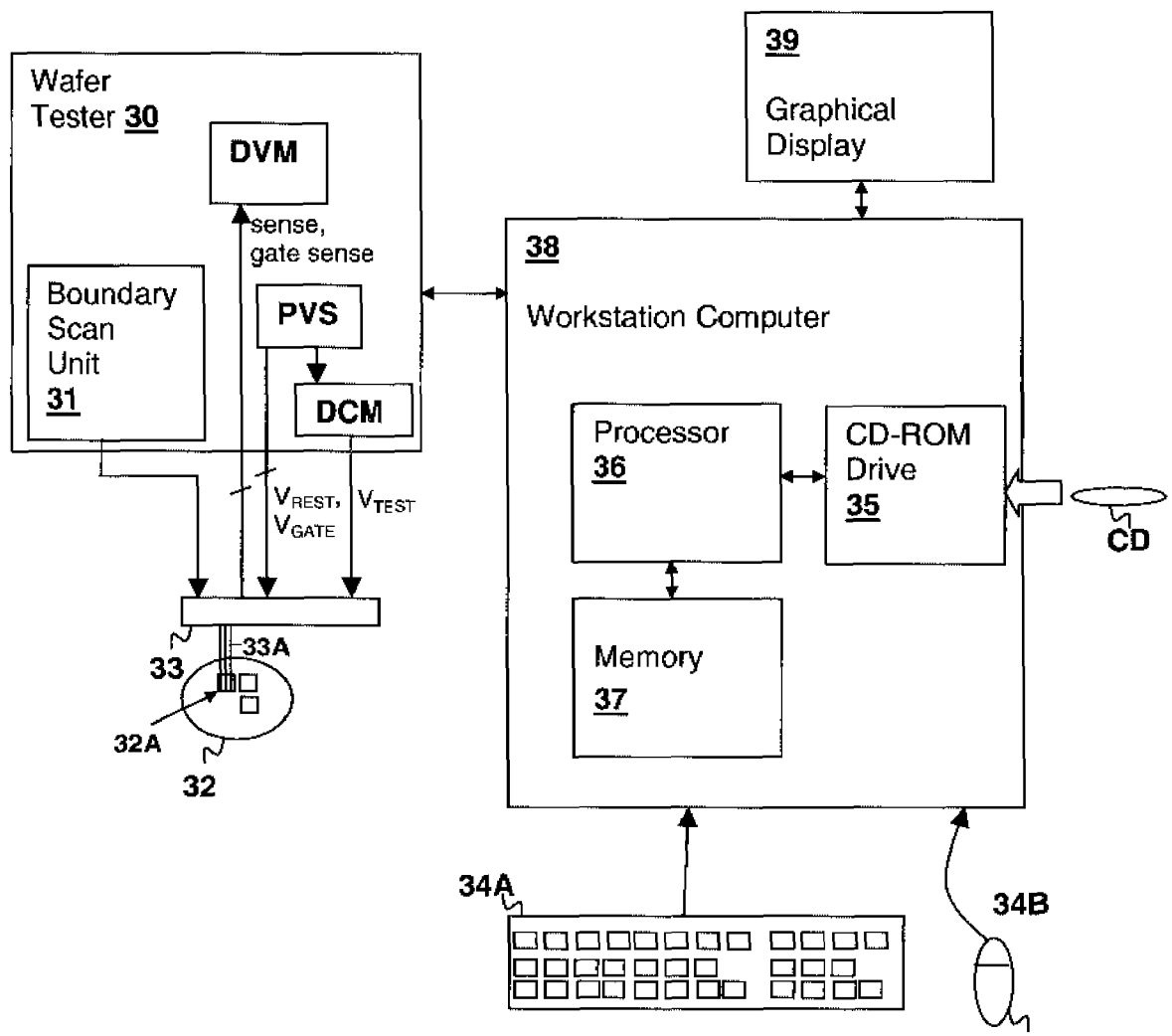
FIG. 3 is a pictorial diagram of a wafer test system in which methods in accordance with an embodiment of the present invention are performed.

Referring now to FIG. 3, a wafer test system in which a method according to an embodiment of the invention is performed, is shown. A wafer tester 30 includes a scan unit 31 for providing stimulus to a die or kerf circuit 32A on a wafer under test 32, via a probe head 33 having electrical test connections 33A to die 32A. Wafer tester 30 also includes a digital voltmeter DVM, which may be part of a parametric measurement unit that also includes a programmable voltage source PVS and a digital current meter DCM, that are all coupled to die 32A via probe head 33 electrical test connections 33A. The outputs of programmable voltage source PVS are connected to pads connected to grids $V_{REST}$, and $V_{GATE}$ and digital current meter DCM, which then supplies current from programmable voltage source PVS to grid $V_{TEST}$. The inputs of digital voltmeter DVM are connected to pads connected to grids sense and gate sense and these signals may also be connected to programmable voltage source PVS for feedback control of the gate and power supply voltages. PVS can also be operated as or supplemented by an AC waveform generator for performing AC device characterization.

A workstation computer 38, having a processor 36 coupled to a memory 37, for executing program instructions from memory 37, wherein the program instructions include program instructions for executing one or more methods in accordance with an embodiment of the present invention, is coupled to wafer tester 30, whereby the measurements described above are performed and measurements collected and stored in memory 37 and/or other media storage such as a hard disk. A CD-ROM drive 35 provides for import of program instructions in accordance with embodiments of the present invention that are stored on media such as compact disc CD. Workstation computer 38 is also coupled to a graphical display 39 for displaying program output such as distributions of the characteristics for devices in the test circuit and ring oscillator currents as provided by embodiments of the present invention. Workstation computer 38 is further coupled to input devices such as a mouse 34B and a keyboard 34A for receiving user input. Workstation computer may be coupled to a public network such as the Internet, or may be a private network such as the various "intra-nets" and software containing program instructions embodying methods in accordance with embodiments of the present invention may be located on remote computers or locally within workstation computer 38. Further, workstation computer 38 may be coupled to wafer tester 30 by such a network connection.

While the system of FIG. 3 depicts a configuration suitable for sequential test of a plurality of dies on a wafer, the depicted system is illustrative and not a limitation of the present invention. Probe head 33 may be a multi-die full wafer probe system, or may comprise multiple probe heads for simultaneously testing multiple wafers on a single or multiple die basis. Alternatively, the die may be already packaged, in which case a custom laboratory system may be used, such as may be required for testing under controlled temperature conditions. Additionally, while scan chain control of selection circuits 12A-12F and 24A-24C is illustrated, the techniques of the present invention may also be applied to execution of test code from a processor incorporated on wafer 32, and current/voltage measurement circuitry may be provided on wafer 32, as well. The resultant generated display or data exported from workstation computer 38 may take the form of graphical depictions of the ring oscillator current and device characteristics within the test circuit, or may graphical or numerical statistical distribution information that describes the variation.

Figure 4:
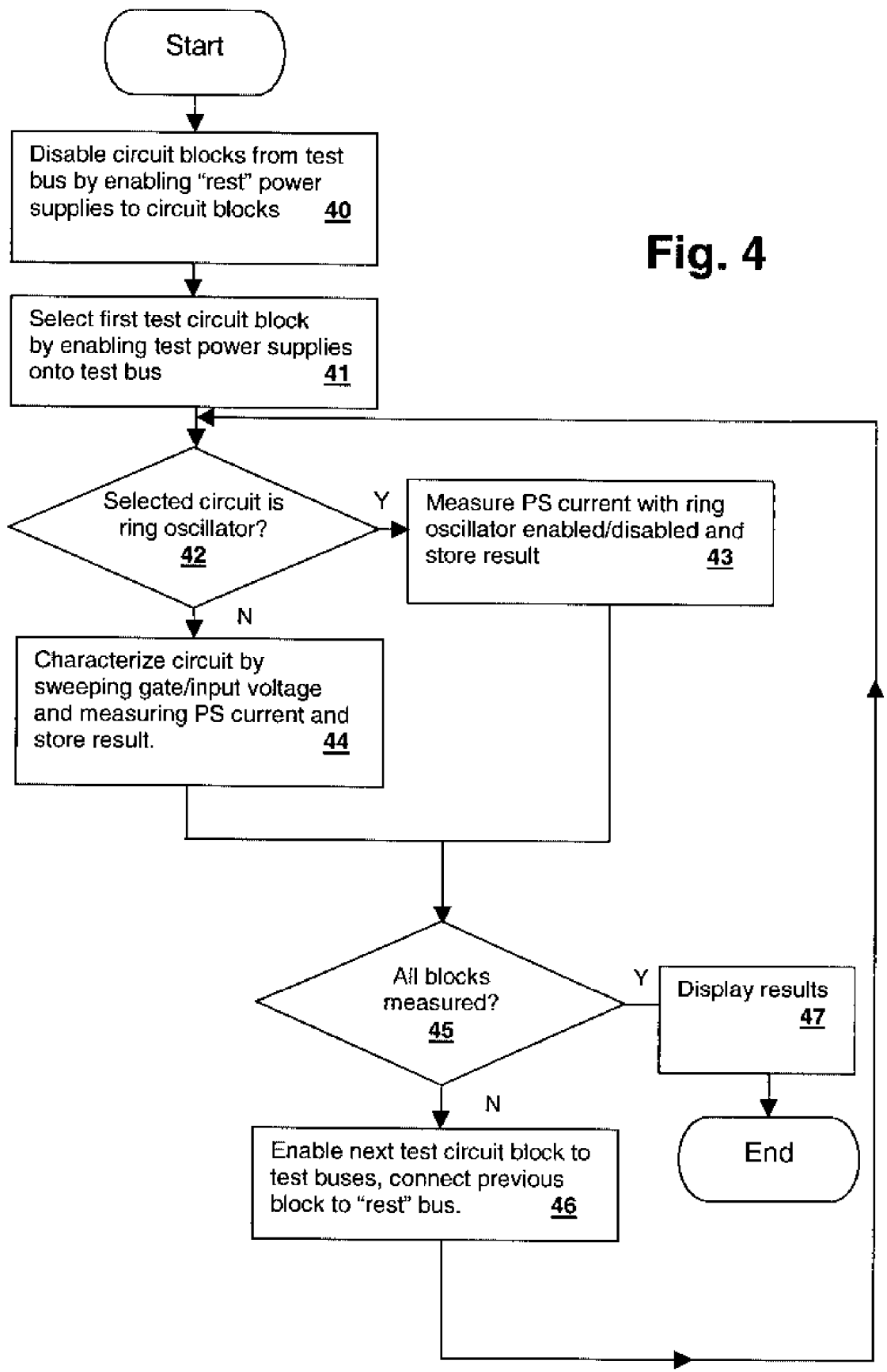
FIG. 4 is a flow chart of a method in accordance with an embodiment of the present invention.

Referring now to FIG. 4, a method in accordance with an embodiment of the invention is depicted in a flowchart. First, the circuit blocks are disabled from power grid $V_{TEST}$ by enabling power grid $V_{REST}$ at the circuit blocks (step 40). Next, one of the circuit blocks is selected by enabling power grid $V_{TEST}$ and sense grid sense at the circuit block and disabling the connection to power grid $V_{REST}$ (step 41). If the selected circuit is a ring oscillator (decision 42), the power supply current is measured along with the ring oscillator frequency with the ring oscillator enabled, leakage current is measured with the ring oscillator disabled and the results are stored (step 43). Otherwise, the circuit is characterized by sweeping the gate/input voltage or providing an AC signal, measuring the power grid current (or capturing its waveform), measuring the sense grid voltage and storing the results (step 44). Until all blocks are measured (decision 45), steps 42-44 are repeated, selecting a different circuit block each repetition of step 42 by enabling the next circuit block to power grid $V_{TEST}$ (step 46) Finally, the results are displayed (step 47). Although the above-described methods and structures characterize ring oscillator currents and static device current/voltage curves, other types of circuit blocks can be characterized by the techniques of the present invention with appropriate control of the circuits and application of power supply grid voltage(s) adapted to the particular circuit blocks.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. An integrated circuit, comprising:
 a plurality of test circuit blocks for characterizing devices and circuit parameters within said integrated circuit, each having a power supply voltage input;
 a plurality of selection circuits, each corresponding to one of said plurality of test circuit blocks and having an output coupled to said power supply voltage input of said corresponding test circuit block;
 a test power grid coupled to said plurality of selection circuits for supplying current to said power supply voltage input of a selected one of said plurality of test circuit blocks; and
 a rest power grid coupled to said plurality of selection circuits for supplying current to said supply voltage input of all non-selected ones of said plurality of test circuit blocks, whereby current provided from said test power grid to said selected test circuit block can be measured in isolation from current drawn by said power supply voltage input of said non-selected test circuit blocks.

2. The integrated circuit of claim 1, further comprising a voltage sense grid coupled to each of said plurality of selection circuits, wherein said selection circuits couple said power supply voltage input of only said selected test circuit block to said voltage sense grid.

3. The integrated circuit of claim 1, further comprising a gate input grid coupled to at least two of said plurality of selection circuits, wherein said at least two selection circuits couple said gate input voltage to a signal input of only said selected test circuit block.

4. The integrated circuit of claim 3, further comprising a gate input voltage sense grid coupled to said at least two selection circuits, wherein said at least two selection circuits couple said signal input of only said selected test circuit block to said gate input voltage sense grid.

5. The integrated circuit of claim 3, wherein at least two of said test circuit blocks are individual devices to be characterized, and wherein said at least two selection circuits are coupled to said individual devices to be characterized, and wherein said current is a current conducted through said individual devices in response to a voltage of said signal input of a selected one of said at least two circuit blocks.

6. The integrated circuit of claim 5, wherein said individual devices are transistors.

7. The integrated circuit of claim 1, wherein said plurality of test circuit blocks are ring oscillators and wherein said current is an operating current of said ring oscillators.

8. The integrated circuit of claim 1, wherein said plurality of test circuit blocks are ring oscillators and wherein said current is a leakage current of said ring oscillators measured when said selected ring oscillator is not oscillating.

9. The integrated circuit of claim 1, further comprising a scan chain having outputs coupled to each of said plurality of selection circuits for selecting said selected test circuit block and de-selecting said non-selected test circuit blocks.

10. A method of measuring current leaked or consumed by a selected test circuit block within an integrated circuit, comprising:
   selecting said selected test circuit block by enabling a transistor that couples a first power supply current from a test power grid to said test circuit block and disabling a second transistor that couples a rest power grid to said test circuit block;
   de-selecting remaining test circuit blocks by enabling at least one third transistor that couples at least one second power supply current from said rest power grid to said remaining test circuit blocks and disabling at least one fourth transistor that couples said test power grid to said remaining test circuit blocks; and
   measuring said first power supply current.

11. The method of claim 10, further comprising:
   measuring a voltage at an input of said selected test circuit block that receives said first power supply current by enabling a fifth transistor that couples said test circuit block to a sense grid, disabling at least one sixth transistor that couples said remaining test circuit blocks to said sense grid, and measuring a voltage of said sense grid; and
   adjusting a voltage of said test power grid to set said measured voltage to a predetermined value.

12. The method of claim 10, wherein said selected test circuit block is a ring oscillator, and further comprising enabling said ring oscillator, whereby said first power supply current is an operating current of said ring oscillator.

13. The method of claim 10, wherein said selected test circuit block is a ring oscillator, and further comprising disabling said ring oscillator, whereby said first power supply current is a leakage current of said ring oscillator.

14. The method of claim 10, wherein said selected test circuit block is an individual device to be characterized, wherein said selecting further comprises enabling a first gate select transistor that couples a gate of said individual device to a input grid, wherein said method further comprises adjusting a voltage of said input grid, and wherein said measuring measures said first power supply current for each value of said adjusting, whereby a static DC characterization of said individual device is performed.

15. The method of claim 10, wherein said selected test circuit block is an individual device to be characterized, wherein said selecting further comprises enabling a first gate select transistor that couples a gate of said individual device to an input grid, wherein said method further comprises providing an AC signal at said input grid, and wherein said measuring measures a waveform of said first power supply current, whereby an AC characterization of said individual device is performed.

16. The method of claim 10, further comprising:
   programming a scan chain with a string of binary values; and
   providing outputs from said scan chain to gates of said first transistor, said second transistor, said at least one third transistor and said at least one fourth transistor, whereby said selecting and deselecting are controlled by said string of binary values.

17. A test workstation computer system including a memory for storing program instructions for measuring leakage and/or operating current of a selected test circuit block within an integrated circuit, a processor for executing said program instructions, an interface to said integrated circuit, and a current meter interfaced to said processor, wherein said program instructions comprise program instructions for:
   selecting via said interface, said selected test circuit block by enabling a transistor that couples a first power supply current from a test power grid to said test circuit block and disabling a second transistor that couples a rest power grid to said test circuit block;
   de-selecting via said interface, remaining test circuit blocks by enabling at least one third transistor that couples at least one second power supply current from said rest power grid to said remaining test circuit blocks and disabling at least one fourth transistor that couples said test power grid to said remaining test circuit blocks; and
   measuring said first power supply current using said current meter.

18. The test workstation computer system of claim 17, further comprising a programmable voltage supply for supplying said first power supply current and a voltage meter and interfaced to said processor, and wherein said program instructions further comprise program instructions for:
   measuring a voltage at an input of said selected test circuit block that receives said first power supply current by enabling a fifth transistor that couples said test circuit block to a sense grid coupled to said voltage meter, disabling at least one sixth transistor that couples said remaining test circuit blocks to said sense grid, and measuring a voltage of said sense grid; and
   adjusting a voltage of said programmable power supply to set said measured voltage to a predetermined value.

19. The test workstation computer of claim 17, wherein said selected test circuit block is a ring oscillator, and further comprising enabling said ring oscillator via said interface, whereby said first power supply current is a current drawn by said ring oscillator.

20. The test workstation computer 17, wherein said selected test circuit block is an individual device to be characterized, further comprising a programmable voltage source interfaced to said processor, wherein said selecting further comprises enabling a first gate select transistor that couples a gate of said individual device to a input grid, wherein said program instructions further comprise program instructions for adjusting a voltage of said input grid supplied from said programmable voltage source, and wherein said program instructions for measuring measure said first power supply current for each value of said adjusting, whereby a static DC characterization of said individual device is performed.

* * * * *